(12) United States Patent
Moriwaka

(10) Patent No.: US 7,790,572 B2
(45) Date of Patent: Sep. 7, 2010

(54) METHOD FOR MANUFACTURING SEMICONDUCTOR SUBSTRATE

(75) Inventor: Tomoaki Moriwaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 160 days.

(21) Appl. No.: 12/238,496

(22) Filed: Sep. 26, 2008

(65) Prior Publication Data

US 2009/0093102 A1  Apr. 9, 2009

(30) Foreign Application Priority Data

Oct. 4, 2007   (JP) .............................. 2007-260579

(51) Int. Cl.
    *H01L 21/30* (2006.01)
(52) U.S. Cl. ............................... 438/458; 257/E21.596
(58) Field of Classification Search ................. 438/458, 438/462, 463; 257/E21.596, E21.134, E21.347, 257/E21.475
    See application file for complete search history.

(56) References Cited

U.S. PATENT DOCUMENTS

| | | | |
|---|---|---|---|
| 5,374,564 A | 12/1994 | Bruel | |
| 5,559,043 A | 9/1996 | Bruel | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1* | 4/2002 | Yamazaki ................... | 438/409 |
| 6,388,652 B1 | 5/2002 | Yamazaki et al. | |
| 6,534,380 B1 | 3/2003 | Yamauchi et al. | |
| 6,602,761 B2* | 8/2003 | Fukunaga ................... | 438/459 |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2* | 4/2005 | Fukunaga ................... | 438/107 |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 2004/0061176 A1 | 4/2004 | Takafuji et al. | |
| 2004/0104424 A1 | 6/2004 | Yamazaki | |

(Continued)

FOREIGN PATENT DOCUMENTS

JP    2000-294754    10/2000

(Continued)

*Primary Examiner*—Thao P. Le
(74) *Attorney, Agent, or Firm*—Eric J. Robinson; Robinson Intellectual Property Law Office, P.C.

(57) ABSTRACT

When a single crystal semiconductor layer is bonded to a base substrate, a silicon oxide film is preferably used for one or both of the base substrate and a single crystal semiconductor substrate. According to this structure, an SOI layer having a strong bonding strength in a bonding portion can be obtained even when a substrate having an upper temperature limit of 700° C. or lower such as a glass substrate is used. In addition, a single crystal semiconductor substrate from which the single crystal semiconductor layer has been separated is reprocessed in such a manner that the single crystal semiconductor substrate is irradiated with laser light from the separation surface side of the single crystal semiconductor substrate, to melt the surface of the single crystal semiconductor substrate during the melting time per area of 0.5 microseconds to 1 millisecond. Then, the reprocessed single crystal semiconductor substrate is reused.

25 Claims, 15 Drawing Sheets

U.S. PATENT DOCUMENTS

| | | |
|---|---|---|
| 2005/0009252 A1 | 1/2005 | Yamazaki et al. |
| 2007/0063281 A1 | 3/2007 | Takafuji et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |

FOREIGN PATENT DOCUMENTS

| | | |
|---|---|---|
| JP | 2004-134675 | 4/2004 |
| JP | 2005-252244 | 9/2005 |

* cited by examiner

Gray Scale Map Type: <none>

Color Coded Map Type: Inverse Pole Figure [100]
Silicon

Boundaries: <none>

Gray Scale Map Type: <none>

Color Coded Map Type: Inverse Pole Figure [100]
Silicon

Boundaries: <none>

METHOD FOR MANUFACTURING SEMICONDUCTOR SUBSTRATE

BACKGROUND OF THE INVENTION

1. Field of the Invention

The present invention relates to a method for manufacturing a semiconductor substrate having a semiconductor layer on its insulating surface.

2. Description of the Related Art

In recent years, a technique for forming a thin film transistor (TFT) using a semiconductor thin film (the thickness of several nm to several hundreds of nm) formed over a substrate having an insulating surface such as glass has been attracted. Thin film transistors are applied to a wide range of electronic devices like integrated circuits and electro-optical devices, and prompt development of thin film transistors that are to be used as switching elements in image display devices, in particular, is being pushed.

Instead of silicon wafers that are manufactured by thinly slicing an ingot of a single crystal semiconductor, semiconductor substrates called silicon-on-insulator (SOI) substrates have been developed, which have a thin single crystal semiconductor layer over an insulating layer, and are more widely used as substrates in manufacturing microprocessors or the like. This is because an integrated circuit using an SOI substrate draws attention as an integrated circuit in which parasitic capacitance between drains of transistors and a substrate can be reduced, performance of the semiconductor integrated circuit can be improved, and low power consumption is achieved.

As a method for manufacturing SOI substrates, a hydrogen ion implantation separation method is known (for example, Reference 1: Japanese Published Patent Application No. 2000-294754). For example, ions of hydrogen or the like are implanted to a silicon wafer provided with a silicon oxide film on its surface to form a microbubble layer serving as a cleavage plane at a predetermined depth from the surface, and a thin film single crystal silicon layer (SOI layer) is bonded to another silicon wafer. Then, the SOI layer is separated from the cleavage plane by heat treatment to form an SOI substrate. The hydrogen ion implantation separation method is also called a Smart Cut (registered trademark) method.

In Reference 1, after the separation, the SOI layer separated from the silicon wafer is irradiated with laser light to planarize the SOI layer.

Meanwhile, a method for forming an SOI layer over an insulating substrate such as glass has been attempted. As an example of SOI substrates in which an SOI layer is formed on a glass substrate, an SOI substrate in which a thin single crystal silicon layer is formed over a glass substrate having a coating film by a hydrogen ion implantation separation method is known (for example, Reference 2: Japanese Published Patent Application No. 2004-134675). In this case also, a thin single crystal silicon layer (SOI layer) is formed on the glass substrate in such a way that a microbubble layer is formed at a predetermined depth from the surface by implantation of hydrogen ions to a silicon wafer, the glass substrate and the silicon wafer are bonded to each other, and the silicon wafer is separated using the microbubble layer as a cleavage plane.

SUMMARY OF THE INVENTION

Display devices typified by liquid crystal displays have larger and larger screen areas in recent years and glass substrates used for such display devices are also being enlarged. A glass substrate is rectangular in shape and had a size of 300 mm×400 mm of the first generation in the beginning of 1990, which has grown to 680 mm×880 mm or 730 mm×920 mm of the fourth generation in 2000.

On the other hand, the wafer size of a semiconductor substrate is limited because a semiconductor substrate is manufactured by forming a columnar ingot of 20 to 30 cm in diameter by a Czochralski method (a CZ method), and slicing the ingot with a diamond blade or the like to a thickness of approximately 0.5 to 1.5 mm to make one circle wafer.

Accordingly, in a case where an active matrix display device is formed using a glass substrate having an area larger than a single crystal semiconductor substrate such as a silicon wafer, by a hydrogen ion implantation separation method, a plurality of thin films of single crystal silicon layers separated from a silicon wafer need to be attached to one glass substrate. Therefore, if it is possible that hydrogen ion implantation separation is conducted to one silicon wafer plural times to be repeated and thus a plurality of thin films of single crystal silicon layers obtained from one silicon wafer can be formed over the glass substrate, an SOI substrate can be formed more efficiently.

However, planarity of a surface of a single crystal semiconductor substrate from which thin films of single crystal silicon layers are separated by a hydrogen ion implantation separation method is damaged severely. The single crystal semiconductor substrate losing planarity has difficulty in being attached to a glass substrate. Thus, it is necessary to recover the planarity of the surface of the single crystal semiconductor substrate in order to obtain thin films of single crystal silicon layers from one single crystal semiconductor substrate by plural times of hydrogen ion implantation separation methods.

As a method for improving the planarity of a surface of a single crystal semiconductor substrate, a CMP (chemical mechanical polishing) process is given. However, the CMP process has a problem in that a substrate material is consumed away so much since the CMP process is a method for mechanically polishing a substrate surface.

In addition, there is a method for conducting laser irradiation for locally heating and melting a single crystal semiconductor substrate, as another method for recovering planarity of a single crystal semiconductor substrate. For example, in a case where a silicon wafer is used as a single crystal semiconductor substrate and an excimer laser which is an ultraviolet ray having a high absorption coefficient with respect to silicon is used, silicon is irradiated with excimer laser light which is high output pulsed laser light, whereby a large amount of heat is supplied to a surface of silicon in an extremely short time. A melting time by a pulsed laser beam can be close to a pulse width of the pulsed laser beam. In a conventional pulsed excimer laser, the pulse width is several tens of nanoseconds to a hundred and several tens of nanoseconds, and thus it can be said that a melting time of a silicon wafer is substantially several tens of nanoseconds to a hundred and several tens of nanoseconds. By use of a pulsed laser such as an excimer laser, a silicon wafer is rapidly heated in an extremely short time, a surface of the silicon wafer and the vicinity thereof are melted, solidification progresses in a direction perpendicular to the surface of the silicon wafer and thus protrusions called ridges are formed on the surface. Accordingly, there is a limit on the recovery of planarity of a surface of the silicon wafer by pulsed laser processing such as an excimer laser.

On the other hand, when a continuous wave laser (hereinafter, CW laser) having a wavelength in an ultraviolet region or a visible light region is delivered to silicon, a state in which it is heated can be maintained longer than when a pulsed laser is used. Thus, the recovery of the planarity of the surface of the silicon wafer can be expected. However, in general, the silicon wafer has a thickness of from 0.5 mm to 1.5 mm and thus as for CW laser light having a wavelength in an ultraviolet region or a visible light region and having a high absorption coefficient with respect to silicon, all energy of the CW laser light is absorbed in the vicinity of the surface of the silicon wafer. Heat generated by irradiation with a CW laser is diffused into the entire of the silicon wafer from the surface. Therefore, the silicon wafer cannot be melted enough to recover the planarity of the silicon wafer.

The present invention has been made in view of the above problem, and thus it is an object of the present invention to provide a method for reprocessing a single crystal semiconductor substrate after a single crystal semiconductor layer is separated from the single crystal semiconductor substrate.

One feature of a method for manufacturing a semiconductor substrate is that ion species are produced by exciting a source gas including one or plural gases selected from a hydrogen gas, a rare gas, a halogen gas, or a halide compound gas and the ion species are introduced into the first single crystal semiconductor substrate to form an embrittlement layer. Then, a bonding layer is formed over the first single crystal semiconductor substrate, the first single crystal semiconductor substrate and the base substrate are bonded with the bonding layer interposed therebetween so that the first single crystal semiconductor substrate and the base substrate are attached to each other. The first single crystal semiconductor substrate is separated by using the embrittlement layer as a cleavage plane by heating the first single crystal semiconductor substrate so that a single crystal semiconductor layer separated from the first single crystal semiconductor substrate is fixed over the base substrate. In this manner, the semiconductor substrate can be manufactured. Further, a second single crystal semiconductor substrate from which the single crystal semiconductor layer has been separated is reprocessed since the planarity of the second single crystal semiconductor substrate is lost. The reprocessing treatment is conducted in such a manner that the second single crystal semiconductor substrate is irradiated with laser light from the separation surface side of the second single crystal semiconductor substrate, to melt the second single crystal semiconductor substrate for 0.5 microseconds to 1 millisecond per area. Then, the second single crystal semiconductor substrate is reused.

In the method for manufacturing a semiconductor substrate of the present invention, a second single crystal semiconductor substrate obtained after the separation is irradiated and scanned with CW laser light having a suitable wavelength, so that the planarity of a surface of the second single crystal semiconductor substrate can be recovered. In addition, by recovering the planarity of the surface of the second single crystal semiconductor substrate, the second single crystal semiconductor substrate can be used again for manufacturing a semiconductor substrate. Further, by using the reprocessed second single crystal semiconductor substrate, a semiconductor device such as an integrated circuit can be manufactured.

A reprocessing treatment can be conducted as follows: the surface of the single crystal semiconductor substrate is irradiated with CW laser light to be melted, thereby planarizing the single crystal semiconductor substrate. By this reprocessing treatment, the single crystal semiconductor substrate can be reused and semiconductor resources can be efficiently utilized. Further, when a semiconductor substrate is manufactured using the reprocessed single crystal semiconductor substrate, manufacturing cost of the substrate can be reduced.

DETAILED DESCRIPTION OF THE INVENTION

Embodiment Modes

An example of a manufacturing method of a semiconductor substrate in Embodiment Modes of the present invention will now be described with reference to drawings. However, the present invention can be embodied in many different modes and it is easily understood by those skilled in the art that the mode and detail thereof can be variously changed without departing from the scope and spirit of the present invention. Accordingly, the present invention should not be interpreted as being limited to the description of the embodiment modes.

Embodiment Mode 1

Figure 1:
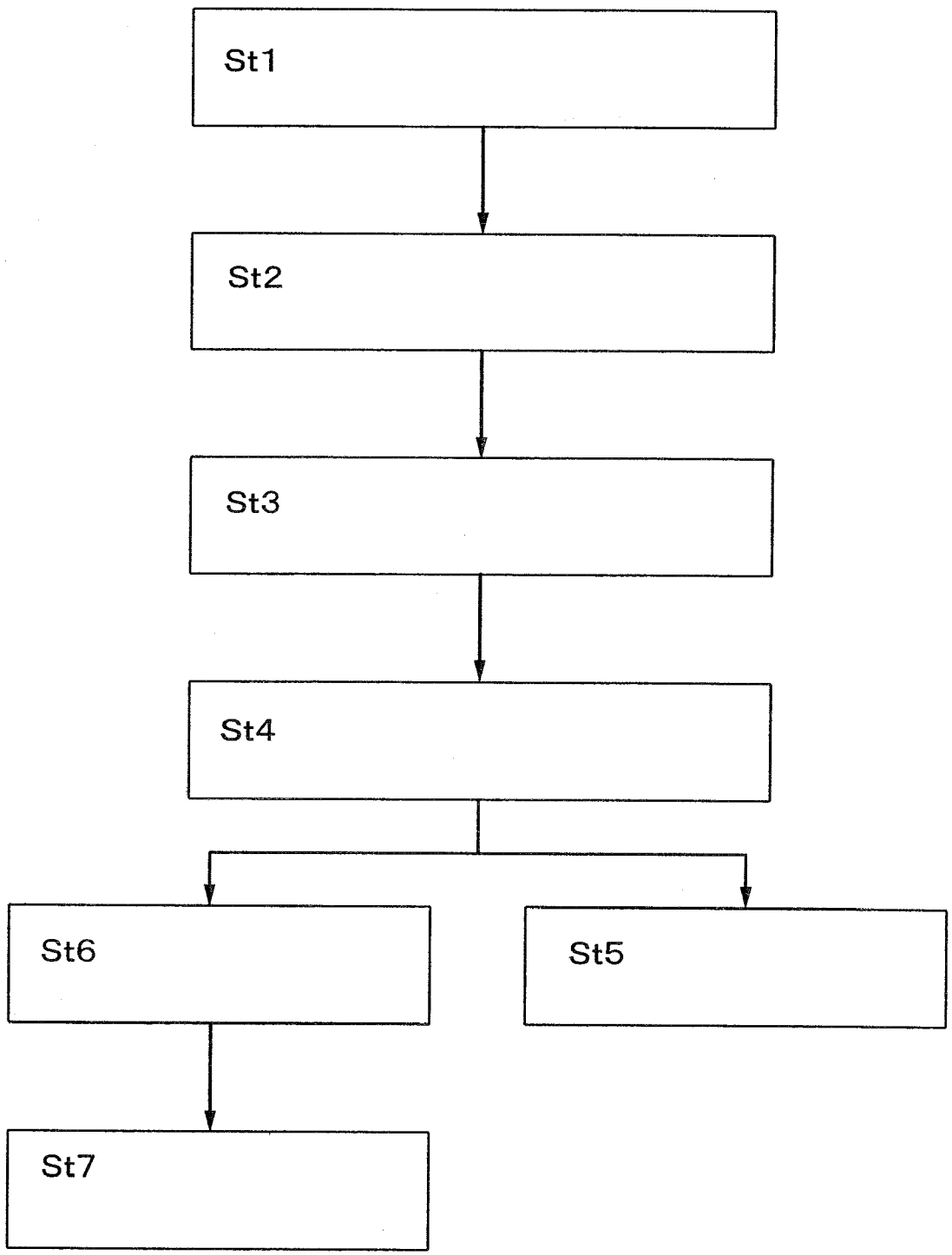
FIG. 1 is a flow chart of an example of a method for manufacturing a semiconductor substrate according to an aspect of the present invention.

The present invention relates to a planarization process of a single crystal semiconductor substrate after a thin film of single crystal semiconductor layer is separated from the single crystal semiconductor substrate. FIG. 1 is a flow chart illustrating a manufacturing process of a semiconductor substrate according to the present invention, as an example.

First, a protective film is formed over a single crystal semiconductor substrate and the single crystal semiconductor substrate is irradiated with an ion beam through the protective film to form an embrittlement layer (ion-implantation layer) (St 1). Then, a bonding layer is formed over the single crystal semiconductor substrate or a base substrate (St 2), and the single crystal semiconductor substrate and the base substrate are bonded to each other (St 3). Then, the single crystal semiconductor substrate is separated from the base substrate by heat treatment, using the embrittlement layer as a cleavage plane (St 4) and thus a semiconductor substrate is manufactured (St 5). In addition, the single crystal semiconductor substrate after the separation is subjected to reprocessing treatment (St 6) and a single crystal semiconductor substrate having improved planarity (also referred to a reprocessed substrate) is manufactured (St 7).

Hereinafter, in this embodiment mode, an example of a method for manufacturing a semiconductor substrate illustrated in FIG. 1 is described specifically with reference to FIGS. 2A to 2C, FIGS. 3A and 3B, and FIGS. 4A and 4B.

First, a single crystal semiconductor substrate 100 is prepared. As the single crystal semiconductor substrate, a substrate formed of single crystal silicon, a single crystal gallium arsenide substrate, or the like can be used. Further, a semiconductor substrate formed of polycrystals of silicon or germanium-gallium arsenide or a substrate on which silicon, germanium-gallium arsenide, or the like is formed, can be used as necessary instead of the single crystal semiconductor substrate. Note that in a case where a polycrystalline semiconductor substrate is used, a cleavage polycrystalline semiconductor layer can be obtained after separation. In this embodiment mode, a silicon wafer having a thickness of 0.7 mm is prepared as the single crystal semiconductor substrate 100.

Figure 2A:
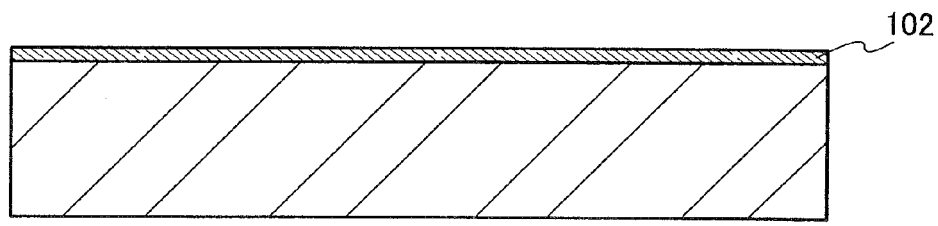
FIGS. 2A to 2C are cross-sectional views of an example of a method for manufacturing a semiconductor substrate according to an aspect of the present invention.

Next, after the surface of the single crystal semiconductor substrate 100 is washed to be cleaned, a protective film 102 is formed over the single crystal semiconductor substrate 100 (FIG. 2A). The protective film 102 is not necessarily formed, but the protective film 102 is preferably formed because the protective film can prevent the single crystal semiconductor substrate 100 from being contaminated by an impurity such as metal and the surface thereof from being damaged by impacts of irradiation ions in a later ion-introduction step.

This protective film 102 can be formed by depositing a single layer or a multilayer of an insulating material(s) such as silicon oxide, silicon nitride, silicon nitride oxide, and/or silicon oxynitride by a CVD method or the like. Alternatively, the protective film can be formed by thermal oxidation of the surface of the single crystal semiconductor substrate 100.

Note that in this specification, an "oxynitride" is a substance that contains more oxygen than nitrogen, and a "nitride oxide" is a substance that contains more nitrogen than oxygen. For example, a "silicon oxynitride film" means a film that contains more oxygen than nitrogen and, in the case where measurements are performed using Rutherford backscattering spectrometry (RBS) and hydrogen forward scattering (HFS), includes oxygen, nitrogen, silicon, and hydrogen at composition ranging from 50 at. % to 70 at. %, 0.5 at. % to 15 at. %, 25 at. % to 35 at. %, and 0.1 at. % to 10 at. %, respectively. Further, a "silicon nitride oxide film" means a film that contains more nitrogen than oxygen and, in the case where measurements are performed using RBS and HFS, includes oxygen, nitrogen, silicon, and hydrogen at composition ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

Figure 2B:
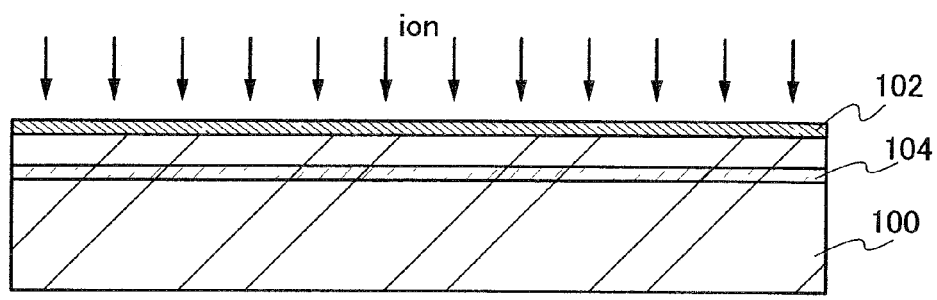

Next, the single crystal semiconductor substrate 100 is irradiated with an ion beam formed of ions accelerated by an electric field, through the protective film 102, and an embrittlement layer 104 is formed in a region at a predetermined depth from the surface of the single crystal semiconductor substrate 100 (FIG. 2B).

The depth of the region where the embrittlement layer 104 is formed can be controlled by the accelerating energy of the ion beam and the incidence angle thereof. The embrittlement layer 104 is formed in a region at substantially the same depth as average depth to which ions enter. In addition, the thickness of the thin film of the single crystal semiconductor layer separated from the single crystal semiconductor substrate 100 is determined on the depth at which ions are introduced. The thickness of the single crystal semiconductor layer that is separated from the single crystal semiconductor substrate 100 is greater than or equal to 5 nm and less than or equal to 500 nm, and the preferable range of the thickness is greater than or equal to 10 nm and less than or equal to 200 nm. The accelerating voltage of ions is adjusted by considering the depth at which ions are introduced.

A hydrogen gas can be used for a source gas in the ion-introduction step. Plural hydrogen ions having different mass numbers, i.e., $H^+$, $H_2^+$, and $H_3^+$ are generated from a hydrogen gas ($H_2$ gas). When a hydrogen gas is used for a source gas, the irradiation amount of $H_3^+$ is preferably the largest of all. When irradiation of $H_3^+$ ions is conducted, ion-introduction efficiency is more improved than the case where irradiation of $H^+$ and $H_2^+$ is conducted, and the irradiation time can be shortened. In addition, a crack is easily formed in the embrittlement layer 104.

Alternatively, as the source gas in the ion-introduction step, as well as a hydrogen gas, one or more kinds of gas selected from a rare gas such as helium or argon, a halogen gas typified by a fluorine gas or a chlorine gas, or a halogen compound gas such as a fluorine compound gas (e.g., $BF_3$) can be used. When helium is used for a source gas, an ion beam with high proportion of $He^+$ ions can be formed without mass separation.

Further, by performing the ion implantation step plural times, the embrittlement layer 104 can be formed. In this case, the same process gas may be used in all ion-introduction steps or difference process gases may be used for each ion-introduction step. For example, ion introduction is performed first using a rare gas as a source gas. Next, an ion-introduction step is performed using a hydrogen gas as a process gas. Alternatively, ion introduction can be performed using a halogen gas or a halide compound gas, and next ion introduction can be performed using a hydrogen gas.

Figure 2C:
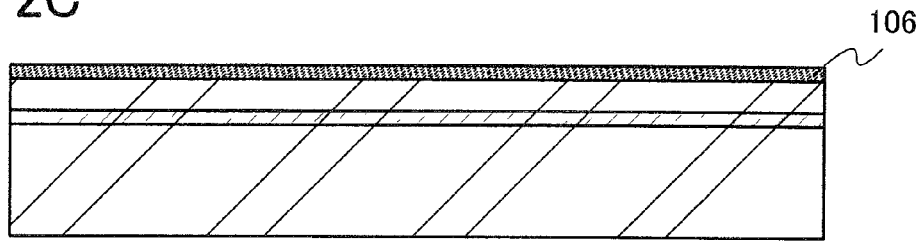

After the embrittlement layer 104 is formed, the protective film 102 is removed by etching. Then, a bonding layer 106 is formed over a surface of the single crystal semiconductor substrate 100 in which the protective film 102 is formed (FIG. 2C). The bonding layer 106 is a layer for forming a smooth and hydrophilic bonding plane on the single crystal semiconductor substrate 100. Such a bonding layer 106 is preferably an insulating film formed by chemical reaction, and especially a silicon oxide film is preferable. The thickness of the silicon oxide film used for the bonding layer 106 can be from 10 nm to 200 nm. The preferable thickness is from 10 nm to 100 nm, and the more preferable thickness is from 20 nm to 50 nm. Without removal of the protective film 102, the bonding layer 106 can be formed on the protective film 102 as well.

When the silicon oxide film of the bonding layer 106 is formed by a chemical vapor deposition (CVD) method, organosilane is preferably used as a silicon source gas. An oxygen ($O_2$) gas can be used as an oxygen source gas. As an organosilane gas, the following can be employed, such as ethyl silicate (tetraethoxysilane, TEOS, chemical formula: $Si(OC_2H_5)_4$), trimethylsilane (TMS: $(CH_3)_3SiH$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$).

The silicon oxide film serving as the bonding layer 106 can be formed by a thermal CVD method using a low temperature oxide (LTO) which is formed at a heat temperature of from 200° C. to 500° C. In this case, silane ($SiH_4$), disilane ($Si_2H_6$), or the like can be used as the silicon source gas, and oxygen ($O_2$), dinitrogen monoxide ($N_2O$), or the like can be used as the oxygen source gas.

Figure 3A:
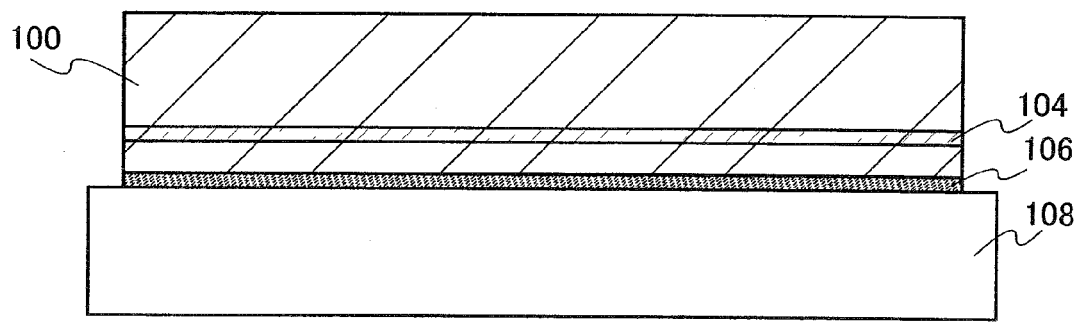
FIGS. 3A and 3B are cross-sectional views of an example of a method for manufacturing a semiconductor substrate according to an aspect of the present invention.

Then, as illustrated in FIG. 3A, a base substrate 108 having an insulating surface and the single crystal semiconductor substrate 100 are attached to each other with the bonding layer 106 interposed therebetween. As the base substrate 108, a light-transmitting glass substrate used for the products of electronics industry such as a liquid crystal display device can be used. It is preferable to use a glass substrate having a coefficient of thermal expansion of from $25 \times 10^{-7}/°$ C. to $50 \times 10^{-7}/°$ C. (preferably, from $30 \times 10^{-7}/°$ C. to $40 \times 10^{-7}/°$ C.) and a strain point of from 580° C. to 680° C. (preferably, from 600° C. to 680° C.) in terms of heat resistance, cost, and the like. Further, a non-alkali glass substrate is preferable as the glass substrate. As a material of the non-alkali glass substrate, a glass material such as aluminosilicate glass, aluminoborosilicate glass, or barium borosilicate glass is used, for example.

As the base substrate 108, as well as the glass substrate, an insulating substrate which is formed of an insulator, such as a ceramic substrate, a quartz substrate, or a sapphire substrate; a conductive substrate which is formed of a conductor such as metal or stainless steel; a semiconductor substrate which is formed of a semiconductor such as silicon or gallium arsenide; or the like can be used.

In addition, a single layer of insulating layer or a multiple layer of two or more insulating layers is/are formed over the cleaned base substrate 108. The thickness of single layer or the multiple layer is from 10 nm to 400 nm. This insulating layer may be attached to the bonding layer 106. In the case where the insulating layer is formed over the base substrate, as a film serving as the insulating layer, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, the following can also be used: an insulating film formed of a metal oxide such as aluminum oxide, tantalum oxide, or hafnium oxide; an insulating film formed of a metal nitride such as aluminum nitride; an insulating film formed of a metal oxynitride such as an aluminum oxynitride film; and/or an insulating film formed of a metal nitride oxide such as an aluminum nitride oxide film.

In a case of using a substrate including an impurity which reduces reliability of a semiconductor device such as an alkali metal or an alkaline earth metal as the base substrate 108, at least one layer of film which can prevent such an impurity from diffusing from the base substrate 108 into a semiconductor layer of an SOI substrate is preferably provided. As such a film, a silicon nitride film, a silicon nitride oxide film, an aluminum nitride film, an aluminum nitride oxide film or the like can be given. With the provision of such a film, the insulating layer can function as a barrier layer.

For example, in the case of forming the insulating layer as a barrier layer with a single layer structure, a silicon nitride film, a silicon nitride oxide film, an aluminum nitride film, or an aluminum nitride oxide film having a thickness of from 10 nm to 200 nm can be formed. In the case where the insulating layer serves as a barrier layer and has a two-layer structure, the following films having a two-layer structure can be given, for example: stacked films of a silicon nitride film and a silicon oxide film, stacked films of a silicon nitride film and a silicon oxynitride film, stacked films of a silicon nitride oxide film and a silicon oxide film, and stacked films of a silicon nitride oxide film and a silicon oxynitride film. Note that in each combination of the above-described films having a two-layer structure, the film mentioned first is formed on the top surface of the base substrate 108. In the insulating layer having a two-layer structure, a film which relaxes stress is preferably selected as an upper layer so that internal stress of a lower layer having a high blocking effect does not influence a semiconductor layer. The thickness of the upper layer can be equal to or greater than 10 nm and equal to or less than 200 nm, and the thickness of the lower layer can be equal to or greater than 10 nm and equal to or less than 200 nm.

In the step of bonding the single crystal semiconductor substrate 100 and the base substrate 108, the surface to be bonded of the base substrate 108 and the surface of the bonding layer 106 formed over the single crystal semiconductor substrate 100 are cleaned by ultrasonic cleaning. Then, by closely attaching the base substrate 108 and the bonding layer 106, Van der Waals force acts on an interface between the base substrate 108 and the bonding layer 106 so that the base substrate 108 and the bonding layer 106 are bonded. When the base substrate 108 and the single crystal semiconductor substrate 100 are brought into close contact, hydrogen bonds are formed between the base substrate 108 and the bonding layer 106, so that the base substrate 108 and the bonding layer 106 are bonded. When a silicon oxide film formed by a CVD method using organosilane is used for the bonding layer 106, the base substrate 108 and the single crystal semiconductor substrate 100 can be bonded at normal temperature without heating the base substrate 108 and the single crystal semiconductor substrate 100.

Note that the bonding layer arranged to attach the single crystal semiconductor substrate 100 and the base substrate 108 may be provided on the base substrate 108 side, or may be provided on both sides of the base substrate 108 and the single crystal semiconductor substrate 100.

In order to form a stronger bonding, for example, the surface of the base substrate 108 may be subjected to oxygen plasma treatment or ozone treatment, so that the surface can be hydrophilic, or heat treatment or pressure treatment may be conducted after the base substrate 108 and the bonding layer 106 are brought into close contact. The temperature of the heat treatment can be from 400° C. to 600° C. The pressure treatment is performed so that force is applied in a direction perpendicular to the bonding interface, and the pressure to be applied is determined in consideration of the strength of the base substrate 108 and the single crystal semiconductor substrate 100.

Heat treatment is conducted to the single crystal semiconductor substrate 100 which is bonded to the base substrate 108 with the bonding layer 106 interposed therebetween so that the single crystal semiconductor substrate 100 can be separated by utilizing the embrittlement layer 104 as a cleavage plane. The heating temperature can be from 400° C. to 600° C. The heating temperature of the single crystal semiconductor substrate 100 is preferably equal to or higher than the temperature of the single crystal semiconductor substrate 100, when the bonding layer 106 is formed.

Figure 3B:
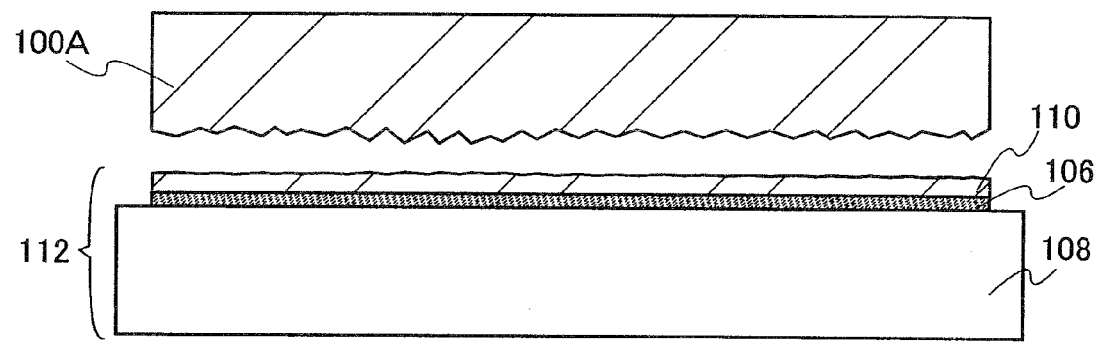

By performing heat treatment in the temperature range of from 400° C. to 600° C., volume change is generated in the minute voids formed in the embrittlement layer 104 in the single crystal semiconductor substrate 100, and a crack is generated in the embrittlement layer 104. As a result, a single crystal semiconductor substrate 100A is separated along the embrittlement layer 104 (FIG. 3B). By this heat treatment, the thin film of single crystal semiconductor layer 110 separated from the single crystal semiconductor substrate 100 is fixed over the base substrate 108. In addition, the bonding interface between the base substrate 108 and the bonding layer 106 is heated by this heat treatment, and covalent bonding with higher bonding force than the hydrogen bonding is formed at the bonding interface; therefore, the bonding force in the bonding interface can be increased.

Through the above steps, a semiconductor substrate 112 in which the thin film of single crystal semiconductor layer 110 is formed over the base substrate 108 is manufactured. On the other hand, the single crystal semiconductor substrate 100A after the separation is thinned by a thickness of the single crystal semiconductor layer 110 separated therefrom and planarity of the surface which has been subjected to the separation is damaged severely and becomes uneven. Therefore, it is not preferable that hydrogen ions are introduced into the single crystal semiconductor substrate 100A after the separation, which is not subjected to planarization process, and a thin film of single crystal silicon layer is formed over a glass substrate using an embrittlement layer as a cleavage plane.

Figure 4A:
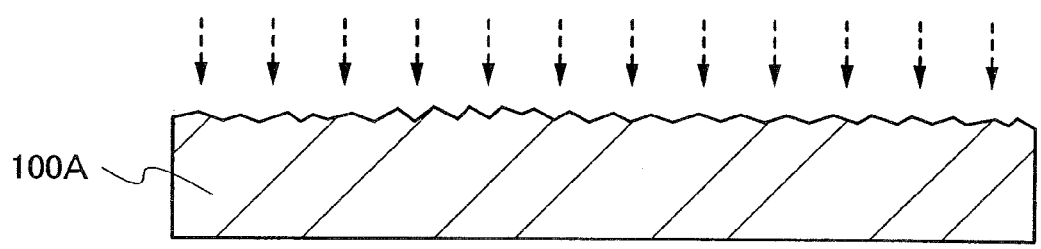
FIGS. 4A and 4B are cross-sectional views of an example of a method for manufacturing a semiconductor substrate according to an aspect of the present invention.
Figure 4B:
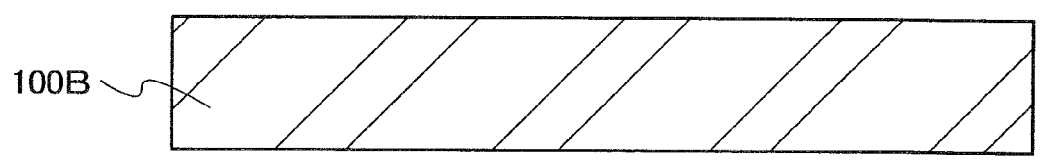

For the reason, reprocessing treatment for the surface of the single crystal semiconductor substrate 100A after the separation is conducted to reuse the single crystal semiconductor substrate 100A after the separation. FIGS. 4A and 4B are cross-sectional views illustrating reprocessing treatment of the single crystal semiconductor substrate 100A. As illustrated in FIG. 4A, the separation surface side of the single crystal semiconductor substrate 100A is irradiated with laser light to melt the single crystal semiconductor substrate 100A. The single crystal semiconductor substrate 100A is melted by laser irradiation and cooled and solidified, and thus crystals are grown in a direction lateral to the thickness direction of the single crystal semiconductor substrate 100A, so that a reprocessed substrate 100B whose surface unevenness is reduced so that the surface can be planarized can be obtained (FIG. 4B). In addition, by the laser irradiation, planarity is improved and crystal defects generated in manufacturing a semiconductor substrate are reduced and thus the reprocessed substrate 100B having improved crystallinity can be obtained. Note that the laser irradiation can be conducted in an air atmosphere.

In the above reprocessing treatment, as the laser light used for the laser irradiation, a CW laser or a pulsed layer having a repetition rate of 10 MHz or more (hereinafter, pseudo CW laser) having a wavelength whose penetration length of light to the single crystal semiconductor substrate is the same as or substantially the same as the thickness of the single crystal semiconductor substrate is used. Continuous irradiation with laser light having such a wavelength allows the whole single crystal semiconductor substrate to be heated in the thickness direction for a long time, and to be melted for a longer time than a case where a pulsed laser or a CW layer having a penetration length of light shorter than the thickness of the single crystal semiconductor substrate is used. In the present invention, by controlling the wavelength and irradiation time of laser light used for irradiation of the single crystal semiconductor substrate, the melting time of the single crystal semiconductor substrate can be set from 0.5 microseconds to 1 millisecond.

By setting the melting time within the above range, after the surface of the single crystal semiconductor substrate is melted by laser irradiation, solidification in a direction perpendicular to the plane direction of the single crystal semiconductor substrate is prevented, and thus crystals can be grown in a direction parallel to the plane direction, i.e., a lateral direction. Note that the melting time of the single crystal semiconductor substrate means a time of from a point at which at least the surface of the single crystal semiconductor substrate and the vicinity thereof begin to melt to a point at which they are solidified completely.

In this specification, the phrase "the wavelength having a penetration length of light which is the same as or substantially the same as the thickness of the single crystal semiconductor substrate" is a wavelength to meet the following expression (1):

$$0.8d \leq \delta \leq 1.5d \, (\delta = \lambda/4\pi k) \quad (1)$$

wherein a wavelength of laser light is $\lambda$, a thickness of the single crystal semiconductor substrate irradiated with laser light is d, a quenching coefficient of the single crystal semiconductor substrate is k, and a penetration length of laser light is $\delta$.

The output of laser light can be selected as appropriate in the range in which the single crystal semiconductor substrate can be heated to a melting point or higher to melt the surface of the single crystal semiconductor substrate. For example, when the beam size in an irradiation plane is $\phi 1$ mm, the output of laser light can be from 200 W to 600 W. In addition, the scan speed of laser light can also be selected as appropriate in the range in which the single crystal semiconductor substrate can be heated to a melting point or higher to melt the surface of the single crystal semiconductor substrate, similar to the output of laser light.

Figure 5:
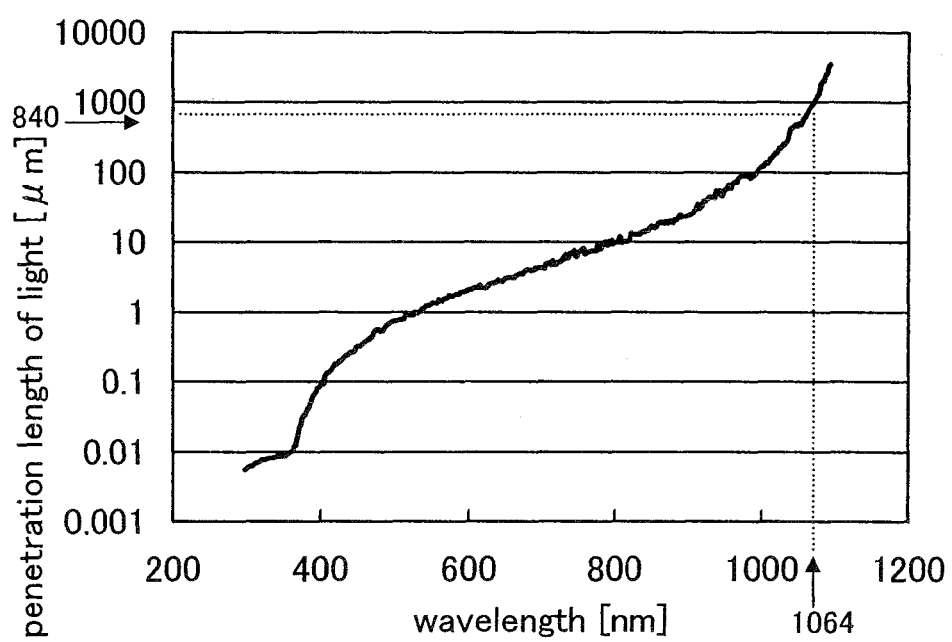
FIG. 5 is a graph showing a relation between a penetration length and a wavelength of light in single crystal silicon.

In this embodiment mode, a silicon wafer is used as the single crystal semiconductor substrate 100A which is subjected to the reprocessing treatment. FIG. 5 shows a relation between a penetration length and a wavelength of light of single crystal silicon which is used as a material of the single crystal semiconductor substrate in this embodiment mode. In FIG. 5, the horizontal axis denotes a wavelength (nm) and the vertical axis denotes a penetration length (μm) of light. As shown in FIG. 5, the penetration length of light with respect to silicon has a strong dependency on a wavelength.

In this embodiment mode, the thickness of the silicon wafer is about 0.7 mm and thus a continuous wave YAG laser which has a penetration length of light to silicon of about 0.84 mm and can oscillate a wavelength of 1064 nm is selected. When the penetration length of light to silicon is about 0.84 mm, the above expression (1) is met, and thus laser light having a wavelength of 1064 nm can heat the whole silicon wafer having a thickness of 0.7 mm in the thickness direction and melt the surface of the silicon wafer. Thus, laser light emitted from a multimode output YAG laser is processed into $\phi 1$ mm in an irradiation plane, and then the separation surface of the silicon wafer is irradiated to be scanned with laser light. In addition, the output power of laser light is e.g., 450 W and the scan speed is e.g., from 1 cm/sec to 100 cm/sec.

Figure 15:
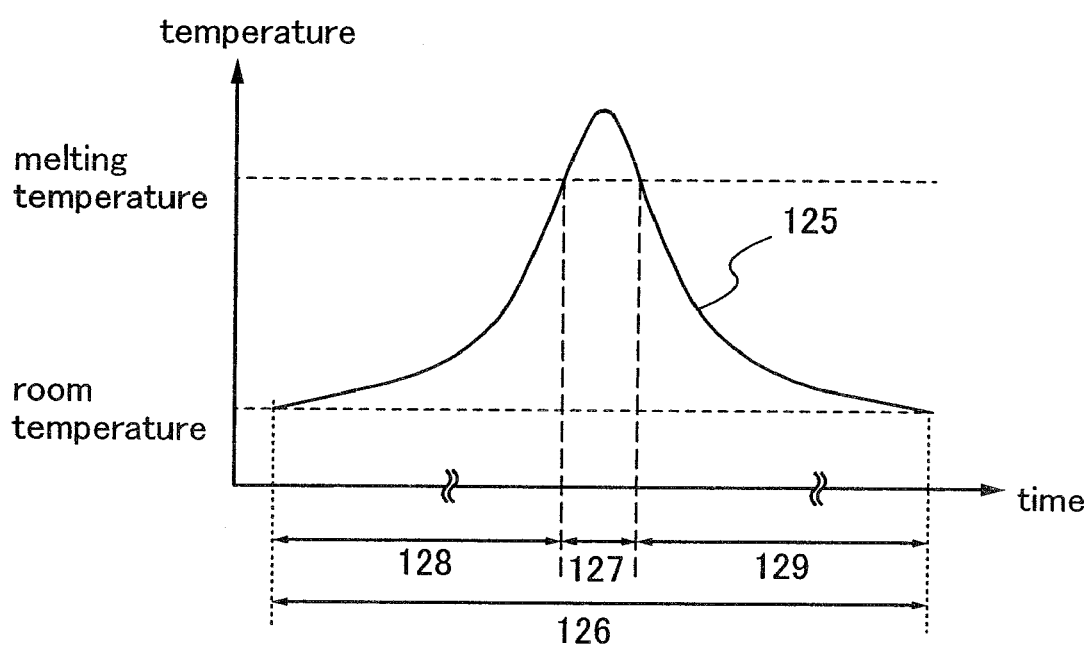
FIG. 15 is a graph showing a temperature of a single crystal semiconductor substrate at the time of CW laser irradiation having a penetration length of light which is the same as or substantially the same as the thickness of the silicon crystal semiconductor substrate.

The irradiation time of laser light per region (per unit area) can be obtained from a beam diameter and a scan speed. In this embodiment mode, the beam diameter is $\phi 1$ mm, and the scan speed is from 1 cm/sec to 100 cm/sec, and thus the irradiation time of laser light per region of the single crystal semiconductor substrate is from 1 millisecond to 10 milliseconds. When the single crystal semiconductor substrate is irradiated with laser light, the energy of the laser light is converted to heat and the heat is transmitted in the plane direction of the single crystal semiconductor substrate and also in the thickness direction. While the energy transmitted in the plane direction is larger than the energy transmitted in the thickness direction, the temperature of the single crystal semiconductor substrate is increased. As a result, as shown in FIG. 15, the temperature of the surface of the single crystal semiconductor substrate 100A and the vicinity thereof (a solid line 125) is not increased rapidly but is gradually increased in a heating time 128.

As described above, in irradiation with CW laser light which has a wavelength in an ultraviolet region or a visible light region and has a high absorption coefficient to silicon, the energy of the laser light is completely absorbed in the surface of the silicon wafer and the vicinity thereof, and the surface of the silicon wafer is melted but the energy of heat transmitted in the thickness direction is so high that crystals are grown in the vertical direction. On the contrary, in the present invention, by irradiation with laser light having a penetration length which is the same as or substantially the same as the thickness of the single crystal semiconductor substrate, the whole single crystal semiconductor substrate can be heated in the thickness direction, and thus solidification of the single crystal semiconductor substrate in the vertical direction can be prevented.

Next, a period during which the temperature of the single crystal semiconductor substrate is greater than or equal to the melting point is a melting period 127. Then, after the melting period, while the energy transmitted in the thickness direction is larger than the energy transmitted in the plane direction, the temperature of the single crystal semiconductor substrate 100A (a solid line 125) is gradually decreased. This period is referred to as a cooling period 129. Accordingly, even when a certain region of the single crystal semiconductor substrate 100A is irradiated with laser light, the time during which the single crystal semiconductor substrate 100A is melted is considered to be about one tenth of a time 126 during which a certain region of the single crystal semiconductor substrate 100A is continuously irradiated. Therefore, for example, when the time during which a certain region of the single crystal semiconductor substrate is irradiated with laser light is from 1 millisecond to 10 milliseconds, the melting time is 0.1 millisecond to 1 millisecond.

In addition, the present invention is not limited to the above example, and any CW laser or pseudo CW laser having such a wavelength that can heat the whole region of a silicon wafer in the thickness direction can be used. For example, an Ar laser, a Kr laser, a $CO_2$ laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, a dye laser, a semiconductor laser or the like can be used. The pseudo CW laser can keep a portion which is being irradiated with laser light in a completely-melted state, as is similar to a CW laser.

The irradiation time of laser light can be set as appropriate within such a range that the melting time of the single crystal semiconductor substrate can be from 0.5 microseconds to 1 millisecond. The irradiation time per region can be calculated by division of the width of a beam spot in the scan direction by the scan speed of laser light. For example, when the width of the beam spot in the scan direction is 5 μm to 15 μm, and the scan speed of 300 mm/sec to 700 mm/sec, the laser irradiation time is 10 microseconds to 50 microseconds. In addition, the melting time per region at this time is 1 microsecond to 5 microseconds.

As described above, the separation surface of the single crystal semiconductor substrate 100A losing planarity after the separation is irradiated with laser light having a wavelength whose penetration length of light which is the same as or substantially the same as the thickness of the single crystal semiconductor substrate 100A, and thus the reprocessed substrate 100B which is the single crystal semiconductor substrate 100A having a surface with improved planarity can be obtained.

After that, a separation step of a thin film of the single crystal semiconductor layer by introduction of hydrogen ions and the reprocessing treatment by laser irradiation are repeated, so that plural pieces of single crystal semiconductor layers 110 can be formed from one single crystal semiconductor substrate 100. Every time the separation step of a thin film of the single crystal semiconductor layer by introduction of hydrogen ions and the reprocessing treatment are repeated, the thickness of the single crystal semiconductor substrate 100 becomes gradually small. Thus, in the reprocessing treatment, a CW laser having a wavelength suitable for the thickness of the single crystal semiconductor substrate, i.e., a wavelength whose the penetration length of light to the single crystal semiconductor substrate which is the same as or substantially the same as the thickness of the single crystal semiconductor substrate is used as appropriate. If a laser whose wavelength is variable is used, one laser can correspond to single crystal semiconductor substrates having different thicknesses, which is efficient. In this manner, by changing the wavelength of the CW laser so as to correspond to the thickness of the single crystal semiconductor substrate for the reprocessing treatment, the single crystal semiconductor substrate can be reused maximally.

When a semiconductor substrate is manufactured using the reprocessed second substrate 100B, before the protective film 102 is formed, a step of removing an oxide film formed over the reprocessed second substrate 100B by laser irradiation is performed by etching or the like as needed.

In addition, similar to the single crystal semiconductor substrate 100A, a top surface of the single crystal semiconductor layer 110 formed over the semiconductor substrate 112 may lose planarity. Therefore, before manufacturing a semiconductor device, chemical mechanical polishing (CMP) is preferably conducted to the surface for improving its planarity. By improvement of the planarity of the single crystal semiconductor layer 110, variation of semiconductor elements which will be formed later can be suppressed. Note that a planarization process may be omitted, if desired characteristics can be obtained.

Moreover, by conducting heating or laser irradiation again, the properties of the single crystal semiconductor layer 110 may be improved or chemical mechanical polishing and laser irradiation may be conducted in combination. Note that the temperature at heat treatment can be set based on the heat-resistance temperature of the base substrate 108. In the case of using a glass substrate as the base substrate 108, a distortion point of the glass substrate is used as a measure of the heat treatment temperature. Specifically, heat treatment may be performed at a temperature approximately in a range from minus about 50° C. to plus 50° C. (from 580° C. to 680° C.) of the strain point. In addition, when the single crystal semiconductor layer 110 is irradiated with laser light, a pulsed laser such as an excimer laser is preferably used, different from the laser used for reprocessing the single crystal semiconductor substrate 100A.

By the method for manufacturing a semiconductor substrate described in this embodiment mode, a single crystal semiconductor substrate after separation can be planarized and reused, and resources can be utilized efficiently. Further, by applying the reprocessing treatment according to the present invention, a reprocessed substrate whose reduction amount of the thickness is extremely small can be provided, unlike a CMP method by which a surface of a substrate is mechanically polished.

Further, by manufacturing a semiconductor substrate using the reprocessed substrate, manufacturing cost of the semiconductor substrate and a semiconductor device using the semiconductor substrate can be reduced.

Embodiment Mode 2

In the method for manufacturing a semiconductor substrate described with reference to FIG. 1, FIGS. 2A to 2C, FIGS. 3A and 3B, and FIGS. 4A and 4B, if a base substrate having an upper temperature limit of 700° C. or lower such as glass is used, a bonding strength with a single crystal semiconductor substrate can be strengthened. Further, a wide variety of kinds of glass substrates such as a non-alkaline glass substrate can be applied for the base substrate. Accordingly, by using a glass substrate as the base substrate, a semiconductor substrate with a large size whose one side is more than one meter can be manufactured. When a plurality of semiconductor elements are provided for such a large-sized semiconductor substrate, a liquid crystal display and an electroluminescent display can be manufactured. In addition to such display devices, various kinds of semiconductor devices such as a solar cell, a photo IC, and a semiconductor memory device can be manufactured using a semiconductor substrate.

Hereinafter, a method for manufacturing a semiconductor device using a semiconductor substrate will be described with reference to FIGS. 6A to 6E and FIGS. 7A and 7B. In this embodiment mode, the semiconductor substrate formed by the method of FIG. 1 is used. Needless to say, semiconductor substrates having other structures can be also used.

Figure 6A:
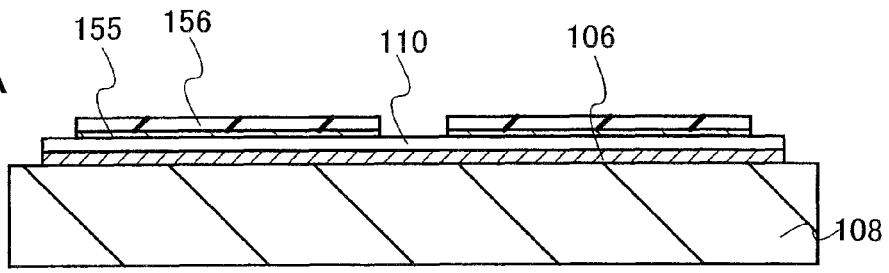
FIGS. 6A to 6E are cross-sectional views of an example of a method for manufacturing a semiconductor device using a semiconductor substrate.

As illustrated in FIG. 6A, the single crystal semiconductor layer 110 is provided over the base substrate 108 with the bonding layer 106 interposed therebetween. First, a silicon nitride layer 155 and a silicon oxide layer 156 are formed over the single crystal semiconductor layer 110, corresponding to an element formation region. The silicon oxide layer 156 is used as a hard mask in etching the single crystal semiconductor layer 110 for element separation. The silicon nitride layer 155 is used as an etching stopper in etching the single crystal semiconductor layer 110. Next, a p-type impurity such as boron, aluminum, or gallium, or an n-type impurity such as arsenic or phosphorus is added to the single crystal semiconductor layer 110 in order to control a threshold voltage. For example, when boron is used as a p-type impurity, boron may be added at concentration of from $5\times10^{17}$ cm$^{-3}$ to $1\times10^{18}$ cm$^{-3}$.

Figure 6B:
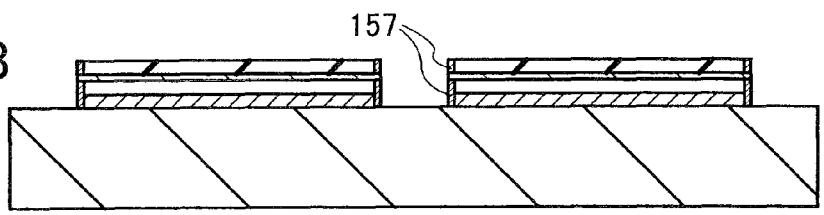

Next, as illustrated in FIG. 6B, the single crystal semiconductor layer 110 and the bonding layer 106 are etched using the silicon oxide layer 156 as a mask. Then, end faces of the single crystal semiconductor layer 110 and the bonding layer 106 which are exposed by etching are nitrided by plasma treatment, so that nitride layers 157 are formed. By this nitriding treatment, a silicon nitride layer is formed at least on a peripheral end portion of the single crystal semiconductor layer 110. The silicon nitride layer has an insulating property and oxidation resistance. Therefore, by forming the silicon nitride layer, leakage current from the end faces of the single crystal semiconductor layer 110 can be prevented, and a bird's beak can be prevented from being formed between the single crystal semiconductor layer 110 and the bonding layer 106 by growth of an oxide film from the end faces.

Figure 6C:
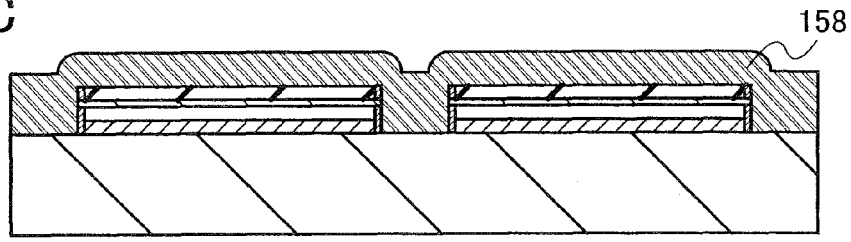

FIG. 6C is a cross-sectional view for describing a step of depositing an element separation insulating layer 158. The element separation insulating layer 158 is formed by depositing a silicon oxide film using TEOS and oxygen by a CVD method. As illustrated in FIG. 6C, the element separation insulating layer 158 is disposed thick so as to fill a space between the single crystal semiconductor layers 110 with the element separation layer 158.

Figure 6D:
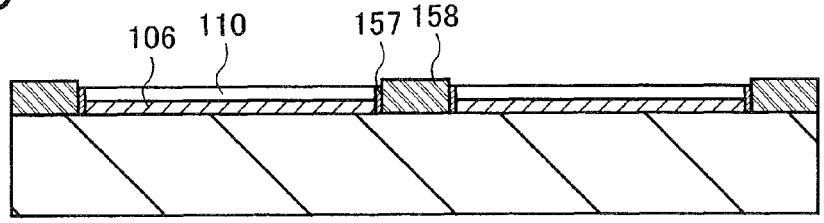

FIG. 6D illustrates a step of removing the element separation insulating layer 158 so as to expose the silicon nitride layer 155. This removing step can be performed by dry etching. At this time, the silicon nitride layer 155 functions as an etching stopper. The element separation insulating layer 158 is left so as to be embedded between the single crystal semiconductor layers 110. The silicon nitride layer 155 is thereafter removed. Note that this removing step can be performed by chemical mechanical polishing.

Figure 6E:
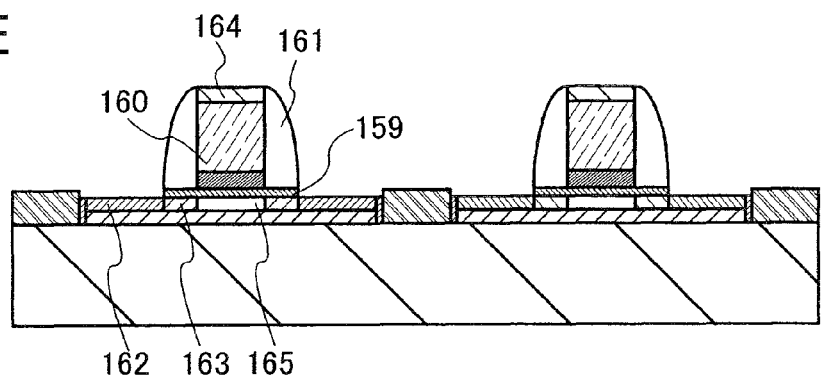

Next, as illustrated in FIG. 6E, a gate insulating layer 159, a gate electrode 160 having a two-layer structure, a sidewall insulating layer 161, a first impurity region 162, a second impurity region 163, and an insulating layer 164 are formed. By forming the first impurity region 162 and the second impurity region 163 in the single crystal semiconductor layer 110, a channel formation region 165 is formed. The insulating layer 164 is formed using silicon nitride and used as a hard mask in etching the gate electrode 160.

Figure 7A:
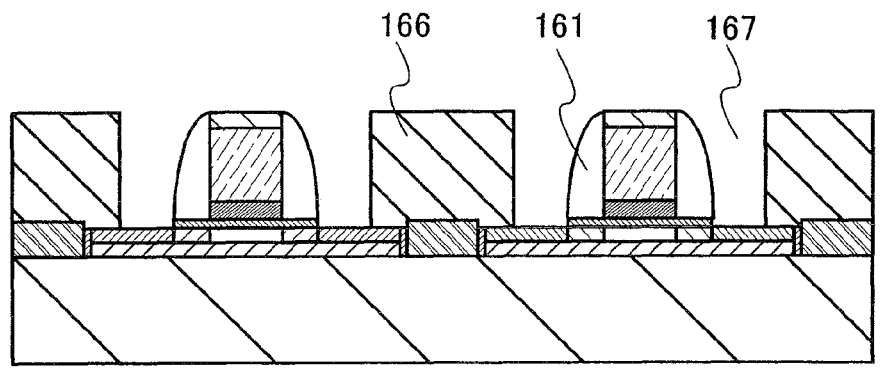
FIGS. 7A and 7B are cross-sectional views of an example of a method for manufacturing a semiconductor device using a semiconductor substrate.

As illustrated in FIG. 7A, an interlayer insulating layer 166 is formed. As the interlayer insulating layer 166, a BPSG (boron phosphorus silicon glass) film is formed and planarized by reflow. Alternatively, a silicon oxide film may be formed using TEOS and planarized by chemical mechanical polishing. In the planarization treatment, the insulating layer 164 over the gate electrode 160 functions as an etching stopper. A contact hole 167 is formed in the interlayer insulating layer 166. The contact hole 167 has a self-align contact structure utilizing the sidewall insulating layer 161.

Figure 7B:
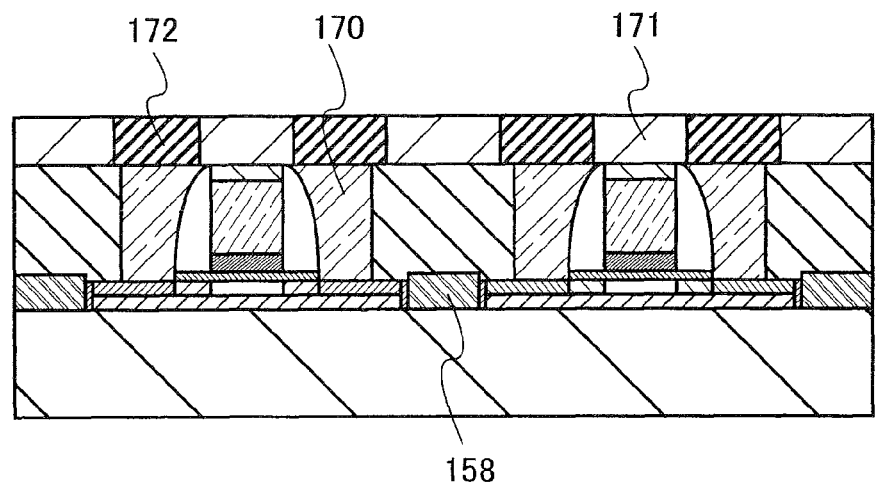

After that, as shown in FIG. 7B, a contact plug 170 is formed using tungsten hexafluoride by a CVD method. Further, an insulating layer 171 is formed; an opening is formed to match the contact plug 170; and a wiring 172 is provided therein. The wiring 172 is formed of aluminum or an aluminum alloy, and is provided with upper and lower metal films of molybdenum, chromium, titanium, or the like as barrier metal films.

In such a manner, a field effect transistor can be manufactured using the single crystal semiconductor layer 110 that is bonded to the base substrate 108. Since the single crystal semiconductor layer 110 in this embodiment mode is a single crystalline semiconductor with uniform crystal orientation, uniform field effect transistors with high performance can be obtained. In other words, it is possible to suppress inhomogeneity of values of important transistor characteristics, such as threshold voltage and mobility, and to achieve high performance such as high mobility.

Semiconductor devices for various use application can be manufactured using a field effect transistor provided for a substrate for semiconductor manufacturing, Hereinafter, a specific mode of a semiconductor device is described with reference to drawings.

Figure 8:
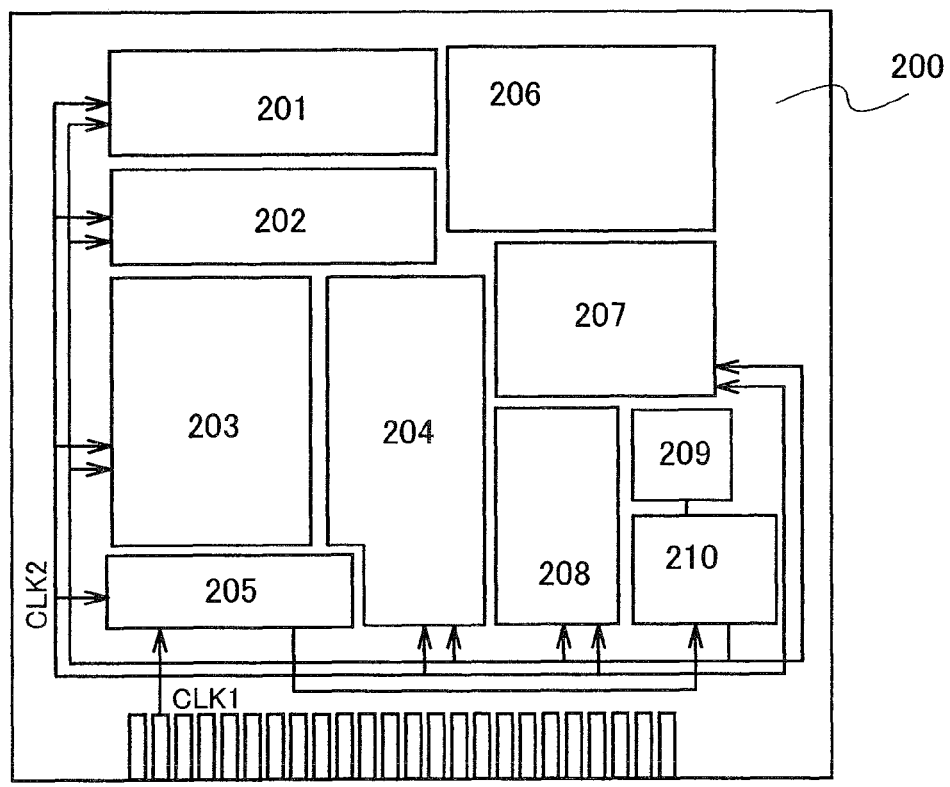
FIG. 8 is a block diagram of a structure of a microprocessor formed using a semiconductor substrate.

First, as an example of a semiconductor device, a microprocessor is described. FIG. 8 is a block diagram showing a structural example of a microprocessor 200.

The microprocessor 200 has an arithmetic logic unit (also referred to as ALU) 201, an ALU controller 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction.

Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207.

For example, the timing controller 205 is provided with an internal clock generator for generating an internal clock signal CLK2 based on a reference clock signal CLK1, and supplies the clock signal CLK2 to the various above-mentioned circuits. Obviously, the microprocessor 200 shown in FIG. 8 is merely an example in which the configuration is simplified, and an actual microprocessor may have a wide variety of configurations depending on the use application.

The above-described microprocessor 200 can achieve not only an increase in processing speed but also a reduction in power consumption because an integrated circuit is formed using a single crystal semiconductor layer (SOI layer) with uniform crystal orientation which is bonded to a substrate having an insulating surface or an insulating substrate.

Figure 9:
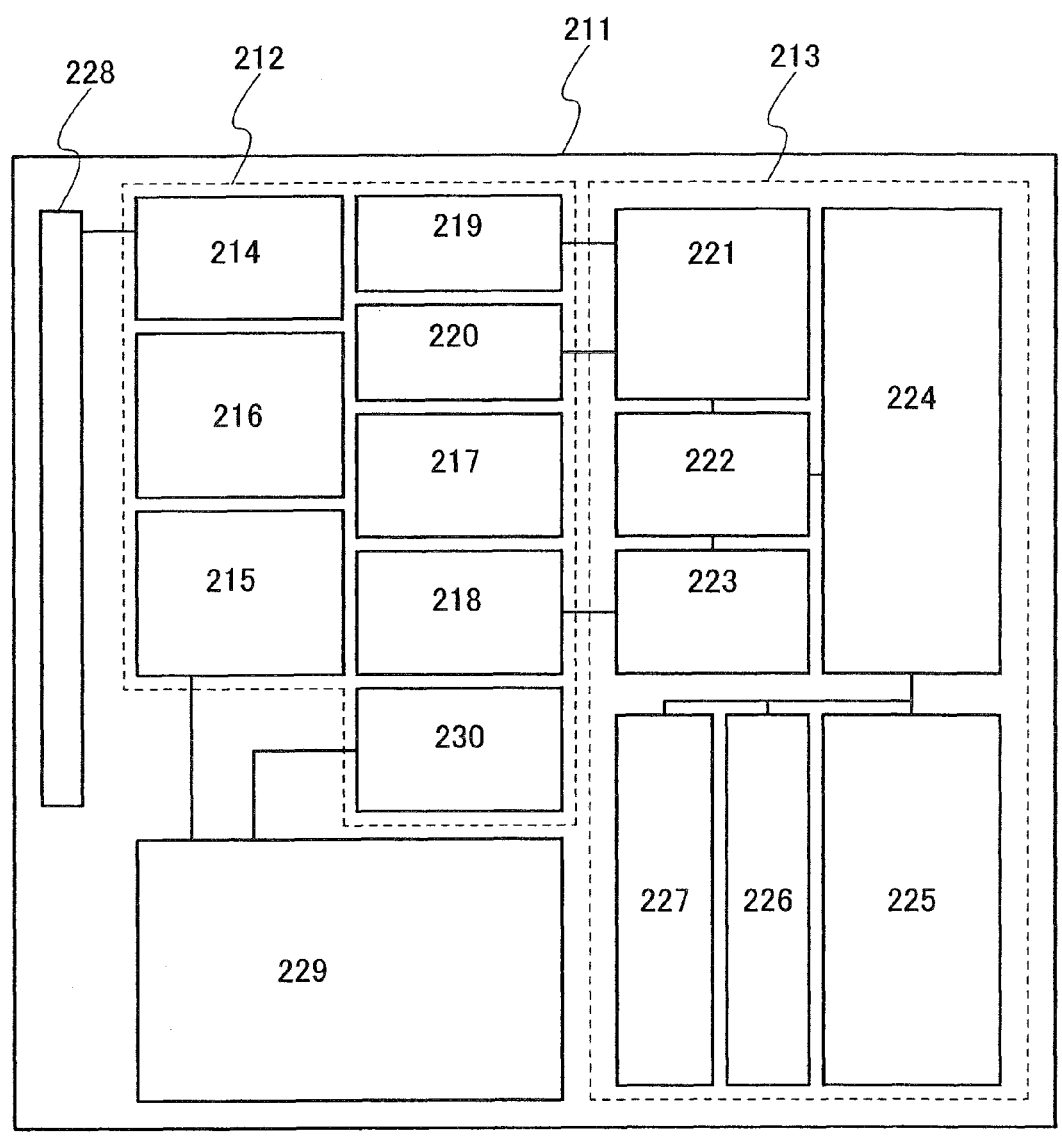
FIG. 9 is a block diagram of a structure of an RFCPU formed using a semiconductor substrate.

Next, an example of a semiconductor device provided with a function of transmitting and receiving data wirelessly and an arithmetic function is described. FIG. 9 is a block diagram illustrating a structural example of such a semiconductor device. A semiconductor device illustrated in FIG. 9 can be a computer that operates to transmit and receive signals to and from an external device by wireless communication (hereinafter, referred to as an RFCPU).

As illustrated in FIG. 9, an RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit (CPU) 225, a random-access memory 226, and a read-only memory 227.

The operation of the RFCPU 211 is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and the capacitor portion 229 can be mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay, as a reset signal. The oscillator circuit 218 changes the frequency and duty ratio of a clock signal in response to a control signal generated by the constant voltage circuit 216. The demodulator circuit 219 demodulates a received signal, and the modulator circuit 220 modulates data to be transmitted.

For example, the demodulator circuit 219 is formed using a low-pass filter and binarizes an amplitude-modulated (ASK) received signal based on variation of amplitude. Since the modulator circuit 220 varies the amplitude of an amplitude-modulated (ASK) transmission signal and transmits the data, the modulator circuit 220 changes the amplitude of a communication signal by changing a resonance point of the resonance circuit 214.

The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like.

The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address which the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, a part of processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using a semiconductor layer with uniform crystal orientation which is bonded to a substrate having an insulating surface or an insulating substrate. This makes it possible to ensure a long-time operation even when the capacitor portion 229 which supplies power is downsized.

Example 1

In Example 1, a single crystal semiconductor substrate obtained by fixing a semiconductor layer over a base substrate and separating it from the base substrate, and a reprocessed substrate obtained by reprocessing the single crystal semiconductor substrate by a reprocess method of a single crystal semiconductor substrate according to the present invention were formed. Then, planarity and crystallinity of the single crystal semiconductor substrate and the reprocessed substrate were compared. Note that a silicon wafer was used as the single crystal semiconductor substrate in this example.

In this example, samples were manufactured by the process described below. First, a silicon wafer having a thickness of 0.7 mm was irradiated with hydrogen ions to form an embrittlement layer, and then a silicon oxide film having a thickness of 50 nm was formed as a bonding layer. Then, the silicon wafer was attached to a glass substrate serving as a base substrate with the bonding layer interposed therebetween, and over the glass substrate, a silicon oxynitride film having a thickness of 50 nm and a silicon nitride oxide film having a thickness of 100 nm were formed as a base insulating film. Next, the silicon wafer was heated, so that a single crystal silicon layer having a thickness of 180 nm separated from the silicon wafer was fixed over the glass substrate and the silicon wafer was separated with the embrittlement layer as a cleavage plane.

Figure 10:
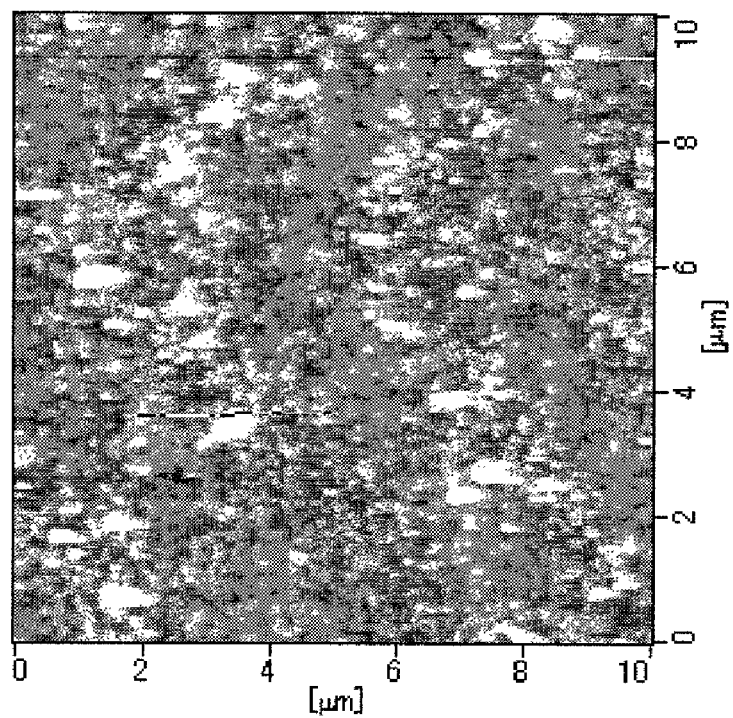
FIG. 10 shows a result of a surface of a silicon wafer from which a single crystal semiconductor layer has been separated, which is measured by a DFM method.

FIG. 10 shows a result of planarity of a separation surface of a silicon wafer from which a single crystal semiconductor layer has been separated, which is measured by a DFM method. As a result of this measurement, in the silicon wafer after the separation, it can be seen that Ra (average roughness) is about 10 nm, and planarity of the surface was greatly lost.

Figure 11A:
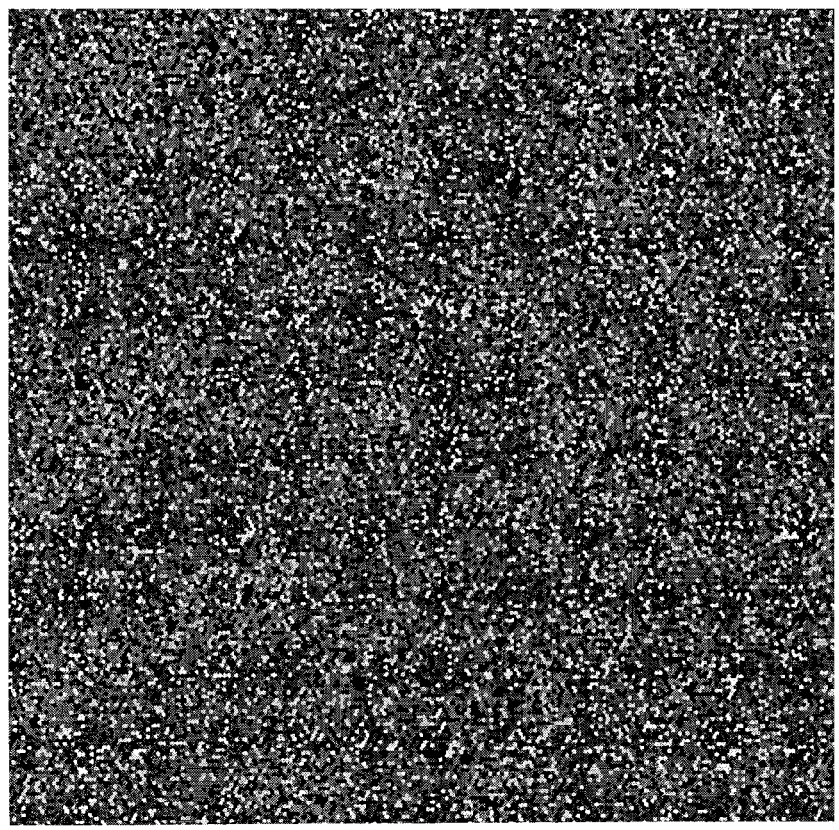
FIGS. 11A and 11B show a result of a surface of a silicon wafer from which a single crystal semiconductor layer has been separated, which is measured by an EBSP method.
Figure 11B:
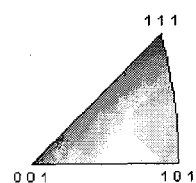

Further, the crystallinity of the separation surface of the silicon wafer was measured by an electron back scatter diffraction pattern (EBSP) method, and FIGS. 11A and 11B shows the measurement result. In this measurement, the measurement range was 100 μm×100 μm. FIG. 11A shows distribution of crystal orientations perpendicular to the surface of the silicon wafer, and black dots represent crystal defects. In addition, FIG. 11B shows plane orientation of FIG. 11A. As seen in FIGS. 11A and 11B, crystal orientations of the silicon wafer after the separation are aligned substantially in one direction and can be regarded as a single crystal, but many crystal defects can be observed. As described above, the surface of the silicon wafer after the separation has bad planarity on its surface and many crystal defects.

Figure 12:
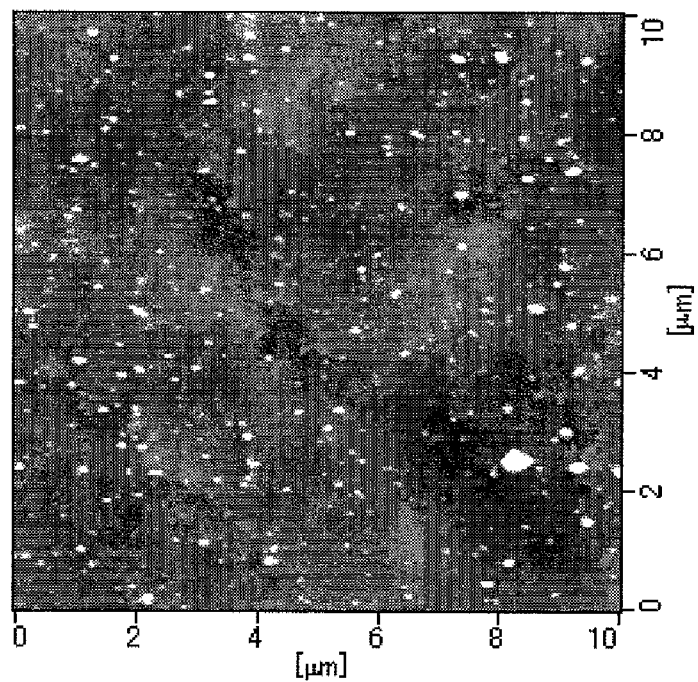
FIG. 12 shows a result of a surface of a silicon wafer from which a single crystal semiconductor layer has been separated and which has been subjected to laser irradiation, which is measured by a DFM method.

FIG. 12 shows a measurement result of planarity of a separation surface of the silicon wafer which has been irradiated with laser light, which was obtained by a dynamic force microscope (DFM) method. In this example, laser light emitted from a multimode output type YAG laser having a wavelength of 1064 nm was processed into φ1 mm in an irradiation surface by an optical system, and a separation surface of the silicon wafer was scanned with laser light. In addition, the output of the laser light was 450 W and the scan speed was 35 cm/sec. At this time, the irradiation time per region of the silicon wafer was about 3 milliseconds and thus the melting time was 0.3 milliseconds.

As seen in the measurement result shown in FIG. 12, Ra (average roughness) of the silicon wafer irradiated with laser light was about 1.4 nm and planarity of the surface was improved more than the silicon wafer which was not irradiated with laser light (the one before the laser irradiation).

Figure 13A:
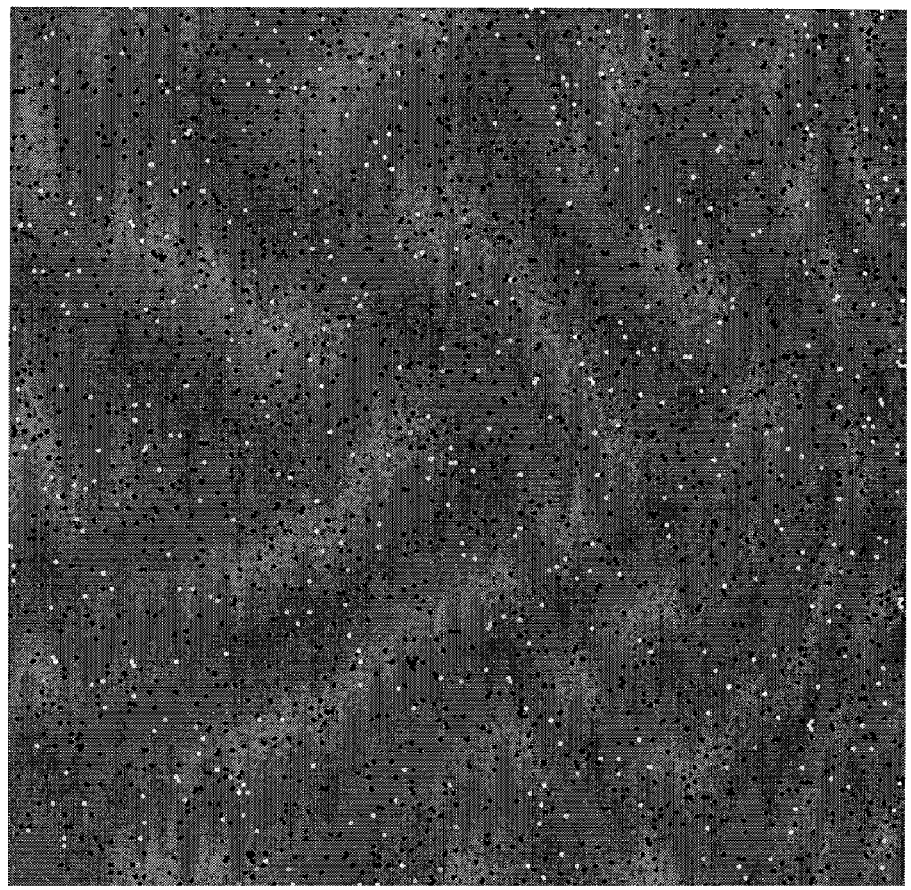
FIGS. 13A and 13B show a result of a surface of a silicon wafer from which a single crystal semiconductor layer has been separated and which has been subjected to laser irradiation, which is measured by an EBSP method.
Figure 13B:
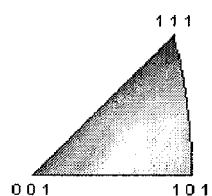

Further, the crystallinity of the surface of the silicon wafer after the laser irradiation was measured by an electron backs scatter diffraction pattern (EBSP) method, and FIG. 13A shows the measurement result. In this measurement, the measurement range was 100 μm×100 μm. FIG. 13B shows plane orientation of FIG. 13A. From the EBSP measurement result shown in FIGS. 13A and 13B, it can be said that the single crystal silicon has much fewer crystal defects than the one before the laser irradiation.

Figure 14:
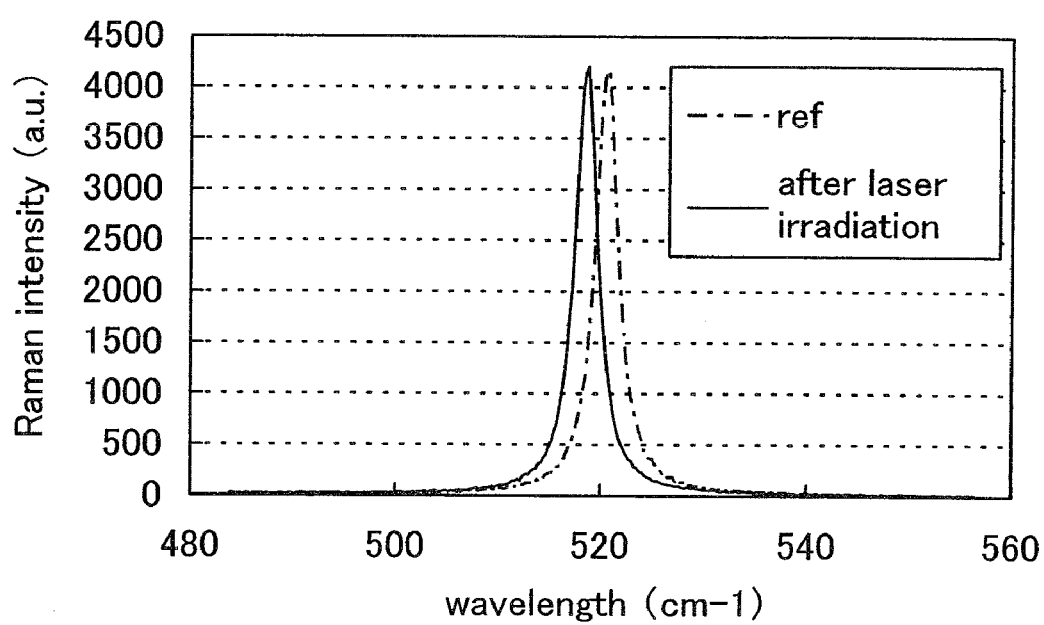
FIG. 14 shows a result of a silicon wafer after laser irradiation, which is measured by Raman spectroscopy.

FIG. 14 shows a measurement result of a laser-irradiated portion of the silicon wafer after the reprocessing treatment, which was obtained by a Raman spectroscopy method. The Raman spectroscopy method is an effective method for evaluating crystallinity of a substance, and is used to quantify crystallinity of the semiconductor film formed by laser irradiation. In general, information or the like on crystallinity or size of crystal grains can be obtained from the peak position of the Raman line.

In FIG. 14, the horizontal axis represents a wavelength ($cm^{-1}$) and the vertical axis represents intensity of Raman scattered light (hereinafter, Raman intensity). In addition, the spectrum represented by a solid line is a spectrum of the silicon wafer irradiated with laser light after the separation and the spectrum represented by a dotted line is a spectrum of the silicon wafer before the separation. From this graph, it can be seen that the peak of the Raman intensity of the silicon wafer irradiated with laser light is close to the peak of the Raman intensity of the silicon wafer before the separation. Therefore, it can be said that the silicon wafer which has been irradiated with laser light (after the laser irradiation) has substantially the same characteristics as the silicon wafer before the separation.

As described above, as for the surface state of the silicon wafer from which a thin film of single crystal semiconductor layer is separated by using the embrittlement layer into which hydrogen ions have been introduced, as a cleavage plane, the planarity and crystallinity of the surface can be recovered by irradiation with CW laser light having a wavelength whose penetration length to silicon which is the same as or substantially the same as the thickness of the silicon wafer and by a long-time melting of the surface and the vicinity thereof. The entire surface of the silicon wafer is irradiated with laser light to recover the planarity and crystallinity, and thus it is possible that a thin film of single crystal silicon layer can be formed again over a glass substrate by utilizing an embrittlement layer formed by introduction of hydrogen ions as a cleavage plane.

This application is based on Japanese Patent Application serial no. 2007-260579 filed with Japan Patent Office on Oct. 4, 2007, the entire contents of which are hereby incorporated by reference.

What is claimed is:

1. A method for manufacturing a semiconductor substrate comprising:
    producing ion species by exciting a source gas including one or plural gases selected from a hydrogen gas, a rare gas, a halogen gas, or a halide compound gas and introducing the ion species into a first single crystal semiconductor substrate to form an embrittlement layer;
    forming a bonding layer over the first single crystal semiconductor substrate;
    bonding the first single crystal semiconductor substrate and a base substrate with the bonding layer interposed therebetween so that the first single crystal semiconductor substrate and the base substrate are attached to each other;
    separating the first single crystal semiconductor substrate by using the embrittlement layer as a cleavage plane by heating the first single crystal semiconductor substrate so that a single crystal semiconductor layer separated from the first single crystal semiconductor substrate is fixed over the base substrate; and
    reprocessing a second single crystal semiconductor substrate from which the single crystal semiconductor layer has been separated,
    wherein the step of reprocessing is conducted in such a manner that the second single crystal semiconductor substrate is irradiated with a laser light from a surface side of the second single crystal semiconductor substrate from which the single crystal semiconductor layer has been separated, to melt the second single crystal semiconductor substrate, and wherein a melting time per area is from 0.5 microseconds to 1 millisecond.

2. The method according to claim 1, wherein the second single crystal semiconductor substrate which is reprocessed has crystals grown in a direction parallel to a plane direction.

3. The method according to claim 1, wherein the laser light is a continuous wave laser light or a pulsed laser light having a repetition rate of 10 MHz or more.

4. The method according to claim 1, further comprising the steps of:

forming a protective film over the first single crystal semiconductor substrate; and irradiating the first single crystal semiconductor substrate with the ion species through the protective film.

5. The method according to claim 4, wherein the protective film is a single layer or a multilayer with two or more layers including at least one of a silicon nitride film and a silicon nitride oxide film.

6. The method according to claim 1, wherein the bonding layer is a silicon oxide film formed by a chemical vapor deposition method using an organosilane gas as a silicon source gas.

7. The method according to claim 6, wherein the organosilane gas is a gas selected from the group consisting of ethyl silicate, trimethylsilane, tetramethylsilane, tetramethylcyclotetrasiloxane, octamethylcyclotetrasiloxane, hexamethyldisilazane, triethoxysilane, and trisdimethylaminosilane.

8. The method for manufacturing a semiconductor substrate according to claim 1, wherein the semiconductor substrate is manufactured by reusing the second single crystal semiconductor substrate which is reprocessed.

9. A method for manufacturing a semiconductor device using the semiconductor substrate formed by the method according to claim 1, comprising the step of forming a semiconductor element including the single crystal semiconductor layer over the base substrate.

10. A method for manufacturing a semiconductor substrate comprising:

producing ion species by exciting a source gas including one or plural gases selected from a hydrogen gas, a rare gas, a halogen gas, or a halide compound gas and introducing the ion species to a first single crystal semiconductor substrate to form an embrittlement layer;

forming a bonding layer over the first single crystal semiconductor substrate;

bonding the first single crystal semiconductor substrate and a base substrate with the bonding layer interposed therebetween so that the first single crystal semiconductor substrate and the base substrate are attached to each other;

separating the first single crystal semiconductor substrate by using the embrittlement layer as a cleavage plane by heating the first single crystal semiconductor substrate so that a single crystal semiconductor layer separated from the first single crystal semiconductor substrate is fixed over the base substrate; and reprocessing a second single crystal semiconductor substrate from which the single crystal semiconductor layer has been separated, wherein the step of reprocessing is conducted in such a manner that the second single crystal semiconductor substrate is irradiated with a laser light from a surface side of the second single crystal semiconductor substrate from which the single crystal semiconductor layer has been separated, to melt the second single crystal semiconductor substrate, wherein a melting time per area is from 0.5 microseconds to 1 millisecond, and wherein a penetration length $\delta$ of the laser light meets an expression $0.8\ d \leq \delta \leq 1.5\ d$ ($\delta = \lambda/4\pi k$) wherein a wavelength of the laser light is $\lambda$, a thickness of the second single crystal semiconductor substrate irradiated with the laser light is d, a quenching coefficient of the second single crystal semiconductor substrate is k, and a penetration length of the laser light is $\delta$.

11. The method according to claim 10, wherein the second single crystal semiconductor substrate which is reprocessed has crystals grown in a direction parallel to a plane direction.

12. The method according to claim 10, wherein the laser light is a continuous wave laser light or a pulsed laser light having a repetition rate of 10 MHz or more.

13. The method according to claim 10, further comprising the steps of:

forming a protective film over the first single crystal semiconductor substrate; and irradiating the first single crystal semiconductor substrate with the ion species through the protective film.

14. The method according to claim 13, wherein the protective film is a single layer or a multilayer with two or more layers including at least one of a silicon nitride film and a silicon nitride oxide film.

15. The method according to claim 10, wherein the bonding layer is a silicon oxide film formed by a chemical vapor deposition method using an organosilane gas as a silicon source gas.

16. The method according to claim 15, wherein the organosilane gas is a gas selected from the group consisting of ethyl silicate, trimethylsilane, tetramethylsilane, tetramethylcyclotetrasiloxane, octamethylcyclotetrasiloxane, hexamethyldisilazane, triethoxysilane, and trisdimethylaminosilane.

17. The method for manufacturing a semiconductor substrate according to claim 10, wherein the semiconductor substrate is manufactured by reusing the second single crystal semiconductor substrate which is reprocessed.

18. A method for manufacturing a semiconductor device using the semiconductor substrate formed by the method according to claim 10, comprising the step of forming a semiconductor element including the single crystal semiconductor layer over the base substrate.

19. A method for manufacturing a semiconductor substrate comprising:

forming a bonding layer over a first single crystal semiconductor substrate;

bonding the first single crystal semiconductor substrate and a base substrate with the bonding layer interposed therebetween so that the first single crystal semiconductor substrate and the base substrate are attached to each other;

separating the first single crystal semiconductor substrate by heating the first single crystal semiconductor substrate so that a single crystal semiconductor layer is separated from the first single crystal semiconductor substrate and fixed over the base substrate; and reprocessing a second single crystal semiconductor substrate from which the single crystal semiconductor layer has been separated, wherein the step of reprocessing is conducted in such a manner that the second single crystal semiconductor substrate is irradiated with a laser light from a surface side of the second single crystal semiconductor substrate from which the single crystal semiconductor layer has been separated, to melt the second single crystal semiconductor substrate, and wherein a melting time per area is from 0.5 microseconds to 1 millisecond.

20. The method according to claim 19, wherein the second single crystal semiconductor substrate which is reprocessed has crystals grown in a direction parallel to a plane direction.

21. The method according to claim 19, wherein the laser light is a continuous wave laser light or a pulsed laser light having a repetition rate of 10 MHz or more.

22. The method according to claim 19, wherein the bonding layer is a silicon oxide film formed by a chemical vapor deposition method using an organosilane gas as a silicon source gas.

23. The method according to claim 22, wherein the organosilane gas is a gas selected from the group consisting of ethyl silicate, trimethylsilane, tetramethylsilane, tetramethylcyclotetrasiloxane, octamethylcyclotetrasiloxane, hexamethyldisilazane, triethoxysilane, and trisdimethylaminosilane.

24. The method for manufacturing a semiconductor substrate according to claim 19, wherein the semiconductor substrate is manufactured by reusing the second single crystal semiconductor substrate which is reprocessed.

25. A method for manufacturing a semiconductor device using the semiconductor substrate formed by the method according to claim 19, comprising the step of forming a semiconductor element including the single crystal semiconductor layer over the base substrate.

* * * * *